US012068136B2

(12) United States Patent
Takeda

(10) Patent No.: US 12,068,136 B2
(45) Date of Patent: Aug. 20, 2024

(54) SUBSTRATE PROCESSING APPARATUS, METHOD OF MANUFACTURING SEMICONDUCTOR DEVICE, AND PLASMA GENERATOR

(71) Applicant: KOKUSAI ELECTRIC CORPORATION, Tokyo (JP)

(72) Inventor: Tsuyoshi Takeda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 516 days.

(21) Appl. No.: 17/191,383

(22) Filed: Mar. 3, 2021

(65) Prior Publication Data

US 2021/0202213 A1 Jul. 1, 2021

Related U.S. Application Data

(63) Continuation of application No. PCT/JP2019/009658, filed on Mar. 11, 2019.

(30) Foreign Application Priority Data

Sep. 20, 2018 (JP) ................. 2018-175638

(51) Int. Cl.
*H01J 37/32* (2006.01)
*H01L 21/02* (2006.01)

(52) U.S. Cl.
CPC .. *H01J 37/32449* (2013.01); *H01J 37/32183* (2013.01); *H01J 37/32669* (2013.01); *H01L 21/02315* (2013.01); *H01J 2237/0266* (2013.01)

(58) Field of Classification Search
CPC ............ C23C 16/45544; C23C 16/517; C23C 16/4401; C23C 16/345; C23C 16/507;
(Continued)

(56) References Cited

U.S. PATENT DOCUMENTS 5,540,824 A 7/1996 Yin et al.
5,710,486 A 1/1998 Ye et al.
(Continued)

FOREIGN PATENT DOCUMENTS

JP 08-213196 A 8/1996
JP 09022795 A * 1/1997
(Continued)

OTHER PUBLICATIONS

Korean Office Action issued on Oct. 19, 2022 for Korean Patent Application No. 10-2021-7006624.
(Continued)

*Primary Examiner* — Yuechuan Yu
(74) *Attorney, Agent, or Firm* — Volpe Koenig

(57) ABSTRACT

There is provided a technique that includes: a process chamber in which a substrate is processed; a gas supply system configured to supply a processing gas into the process chamber; a first plasma generator installed to be wound around an outer periphery of the process chamber and configured to generate plasma from the processing gas in the process chamber; and a second plasma generator installed at an upper portion of the process chamber to protrude toward an inside of the process chamber and configured to generate plasma from the processing gas in the process chamber.

11 Claims, 5 Drawing Sheets

(58) Field of Classification Search
CPC ............ C23C 16/45553; C23C 16/509; C23C 16/45542; H01J 37/32669; H01J 37/3211; H01J 37/32183; H01J 37/321; H01J 37/32449; H01J 37/32119; H01J 2237/0266; H01L 21/02315; H01L 21/0228; H01L 21/02274; H01L 21/02211; H01L 21/0217
See application file for complete search history.

(56) References Cited

U.S. PATENT DOCUMENTS

| | | | |
|---|---|---|---|
| 2002/0028567 | A1 | 3/2002 | Aruga et al. |
| 2008/0061702 | A1* | 3/2008 | Ushakov ............ H01J 37/32091 315/111.21 |
| 2009/0236314 | A1* | 9/2009 | Chen ................. H01J 37/32357 156/345.33 |
| 2014/0150975 | A1* | 6/2014 | Ebe ................... H01J 37/32082 156/345.48 |
| 2015/0093913 | A1 | 4/2015 | Toyoda et al. |
| 2015/0200081 | A1 | 7/2015 | Nakayama |

FOREIGN PATENT DOCUMENTS

| | | | | |
|---|---|---|---|---|
| JP | 09-074089 | A | | 3/1997 |
| JP | 11-087092 | A | | 3/1999 |
| JP | 11260596 | A | * 9/1999 | ........ H01J 37/32082 |
| JP | 2002-075977 | A | | 3/2002 |
| JP | 2008-243917 | A | | 10/2008 |
| JP | 2012-114267 | A | | 6/2012 |
| JP | 2015-092533 | A | | 5/2015 |
| KR | 10-2013-0056901 | A | | 5/2013 |
| WO | 2012/032596 | A1 | | 3/2012 |
| WO | 2014/050979 | A1 | | 4/2014 |

OTHER PUBLICATIONS

Japanese Office Action issued on Nov. 16, 2021 for Japanese Patent Application No. 2020-547917.

International Search Report, PCT/JP2019/009658, Jun. 4, 2019, 2 pgs.

* cited by examiner

US 12,068,136 B2

SUBSTRATE PROCESSING APPARATUS, METHOD OF MANUFACTURING SEMICONDUCTOR DEVICE, AND PLASMA GENERATOR

CROSS-REFERENCE TO RELATED APPLICATION

The application is a Bypass Continuation Application of PCT International Application No. PCT/JP2019/009658, filed on Mar. 11, 2019 and designating the United States, the international application being based upon and claiming the benefit of priority from Japanese Patent Application No. 2018-175638, filed on Sep. 20, 2018, the entire content of which is incorporated herein by reference.

TECHNICAL FIELD

The present disclosure relates to a substrate processing apparatus, a method of manufacturing a semiconductor device, and a plasma generator.

BACKGROUND

In the related art, circuit patterns are becoming miniaturized according to the increasing integration of semiconductor devices represented by large scale integrated circuits (LSIs), dynamic random access memories (DRAMs), flash memories, and the like. In the processes of manufacturing a semiconductor device, a process in which a plasma is used is often carried out as a process to realize miniaturization.

Although uniform processing is needed in a substrate surface according to the miniaturization, an activated gas may not be uniformly supplied into the substrate surface. In such a case, it becomes difficult to form a uniform film in the substrate surface.

SUMMARY

The present disclosure provides some embodiments of forming a uniform film in a substrate surface.

According to some embodiments of the present disclosure, there is provided a technique that includes: a process chamber in which a substrate is processed; a gas supply system configured to supply a processing gas into the process chamber; a first plasma generator installed to be wound around an outer periphery of the process chamber and configured to generate plasma from the processing gas in the process chamber; and a second plasma generator installed at an upper portion of the process chamber to protrude toward an inside of the process chamber and configured to generate plasma from the processing gas in the process chamber.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will now be described.

EMBODIMENTS

Hereinafter, some embodiments of the present disclosure will be described with reference to the drawings.

(1) Configuration of the Substrate Processing Apparatus

First, a substrate processing apparatus according to some embodiments of the present disclosure will be described.

A substrate processing apparatus 100 according to the some embodiments will be described. The substrate processing apparatus 100 is, for example, an insulating film-forming unit, and is configured as a single-wafer-type substrate processing apparatus, as illustrated in FIG. 1.

Figure 1:
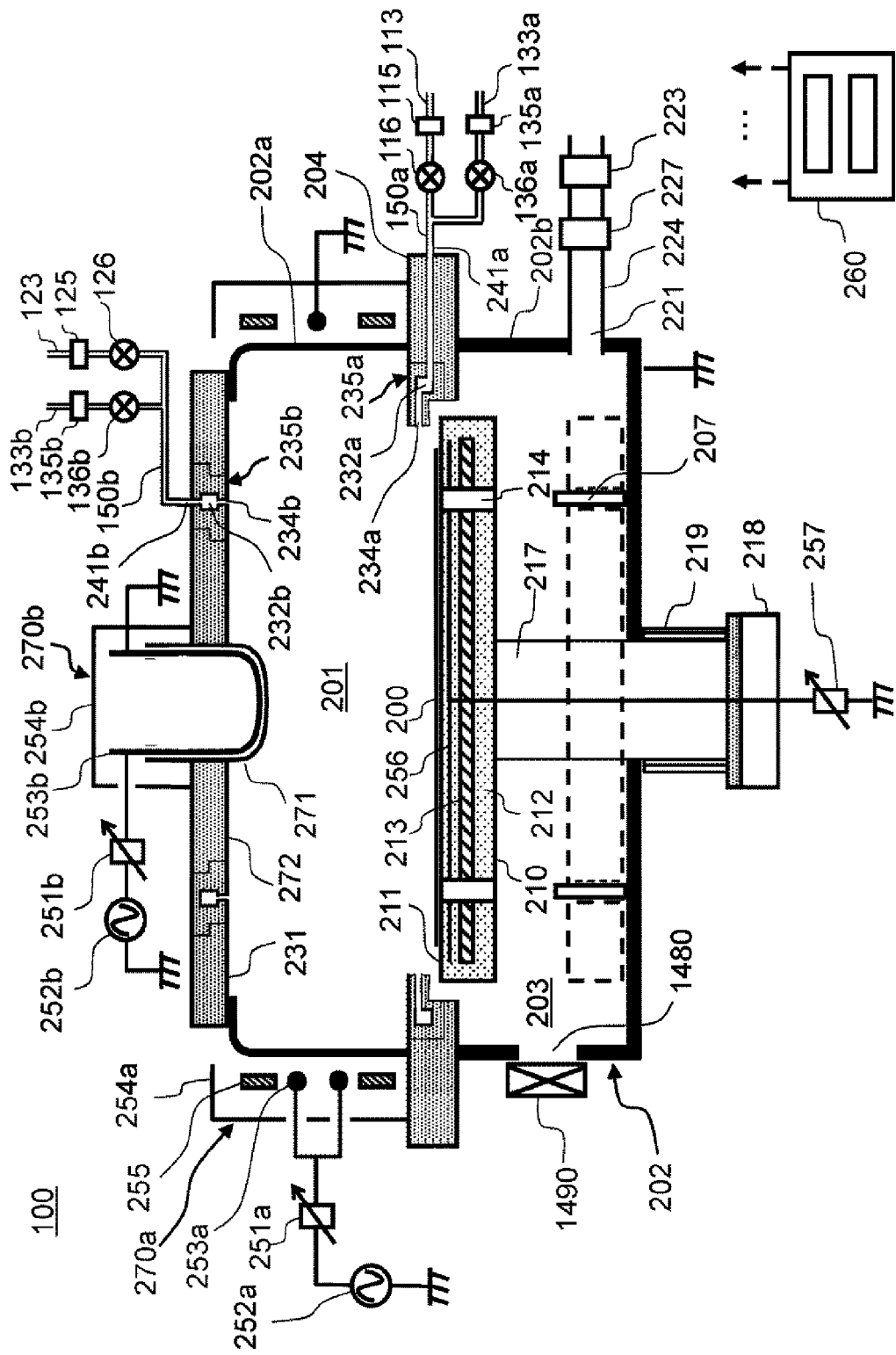
FIG. 1 is a schematic configuration diagram of a substrate processing apparatus according to some embodiments of the present disclosure.

As illustrated in FIG. 1, the substrate processing apparatus 100 includes a process vessel 202. The process vessel 202 has, for example, a circular horizontal cross section, and is configured as a flat sealed vessel. Further, the process vessel 202 is made of a metal material such as aluminum (Al) or stainless steel (SUS), or an insulating material such as quartz or alumina. A process chamber 201 in which a wafer 200 such as a silicon wafer as a substrate is processed, and a transfer chamber 203 are formed in the process vessel 202. The process vessel 202 mainly includes a lid 231, an upper vessel 202a, a lower vessel 202b, and a partition plate 204 installed between the upper vessel 202a and the lower vessel 202b. In addition, a space surrounded by the lid 231, the upper vessel 202a, the partition plate 204, a second gas dispersion plate unit 235b as described below, and a second plasma generator 270b as described below will be referred to as the process chamber 201, and a space surrounded by the lower vessel 202b will be referred to as the transfer chamber 203.

A substrate loading/unloading port 1480 adjacent to a gate valve 1490 is installed on a side surface of the lower vessel 202b, and the wafer 200 is moved to and from a transfer chamber (not shown) via the substrate loading/unloading port 1480. A plurality of lift pins 207 are installed at the bottom of the lower vessel 202b. Further, the lower vessel 202b is grounded.

A substrate support 210 configured to support the wafer 200 is installed in the process chamber 201. The substrate support 210 mainly includes a substrate mounting surface 211 on which the wafer 200 is mounted, a substrate mounting table 212 having the substrate mounting surface 211 on its surface, a heater 213 as a heating part included in the substrate mounting table 212, and a susceptor electrode 256.

Through-holes 214, through which the lift pins 207 pass, are respectively installed at positions corresponding to the lift pins 207 in the substrate mounting table 212.

A bias regulator 257 is connected to the susceptor electrode 256 and configured to be capable of regulating a potential of the susceptor electrode 256. The bias regulator 257 is configured to regulate the potential of the susceptor electrode 256 by a controller 260.

The substrate mounting table 212 is supported by a shaft 217. The shaft 217 penetrates a bottom of the lower vessel 202b and is connected to an elevator mechanism 218 outside the lower vessel 202b. The wafer 200 mounted on the substrate mounting surface 211 can be raised or lowered by operating the elevator mechanism 218 to move the shaft 217 and the substrate mounting table 212 up or down. Further, a periphery of the lower end portion of the shaft 217 is covered with a bellows 219 such that hermeticity of the process chamber 201 is maintained.

The substrate mounting table 212 is lowered to a wafer transfer position indicated by a broken line in FIG. 1 when the wafer 200 is transferred, and is raised to a processing position (wafer processing position) indicated in FIG. 1 when the wafer 200 is processed.

Specifically, when the substrate mounting table 212 is lowered to the wafer transfer position, the upper end portions of the lift pins 207 protrude from the upper surface of the substrate mounting surface 211 via the through-holes 214 such that the lift pins 207 support the wafer 200 from below. Further, when the substrate mounting table 212 is raised to the wafer processing position, the lift pins 207 are buried from the upper surface of the substrate mounting surface 211 such that the substrate mounting surface 211 supports the wafer 200 from below. In addition, since the lift pins 207 are brought into direct contact with the wafer 200, the lift pins 207 may be made of a material such as quartz, alumina, and silicon carbide.

(Exhaust System)

An exhaust port 221 configured to exhaust the atmosphere of the process chamber 201 and the transfer chamber 203 is installed at a side portion of the lower vessel 202b. An exhaust pipe 224 is connected to the exhaust port 221, and a pressure regulator 227 such as an auto pressure controller (APC) or the like, which controls the process chamber 201 to a predetermined pressure, and a vacuum pump 223 are sequentially connected in series to the exhaust pipe 224.

(Gas Introduction Port)

A first gas introduction port 241a configured to supply various types of gases to the process chamber 201 is installed at a side portion of the partition plate 204. Further, a second gas introduction port 241b configured to supply various types of gases to the process chamber 201 is installed above the process chamber 201. A configuration of each gas supply unit connected to the first gas introduction port 241a which is a first gas supply part and the second gas introduction port 241b which is a second gas supply part will be described below.

(Gas Dispersion Unit)

A first gas dispersion unit 235a as a mechanism configured to disperse a gas has an annular shape formed of a first buffer chamber 232a and a plurality of first dispersion holes 234a, and is disposed adjacent to the partition plate 204. Similarly, the second gas dispersion unit 235b has an annular shape formed of a second buffer chamber 232b and a plurality of second dispersion holes 234b, and is disposed between the lid 231 and the second plasma generator 270b described below. A first gas introduced from the first gas introduction port 241a is supplied to the first buffer chamber 232a of the first gas dispersion unit 235a, and is supplied to the process chamber 201 via the plurality of first dispersion holes 234a. A second gas introduced from the second gas introduction port 241b is supplied to the second buffer chamber 232b of the second gas dispersion unit 235b, and is supplied to the process chamber 201 via the plurality of second dispersion holes 234b.

(First Plasma Generator)

A first plasma generator 270a, which is disposed to be wound around the outer periphery of the upper vessel 202a, includes a spiral-shaped coil electrode (coil) 253a formed of a conductive metal pipe and having 1 to 10 turns, and a cylindrical electromagnetic shield 254a formed of a conductive metal plate. High-frequency power from a high-frequency power source 252a is supplied via a matching apparatus 251a connected in parallel to both ends of the coil electrode 253a, and a ground part to which a vicinity of the middle of the coil electrode 253a and the electromagnetic wave shield 254a are connected. When a reaction gas is supplied to the process chamber 201, an inductively coupled plasma (ICP) is generated by an AC magnetic field induced by the coil electrode 253a. Permanent magnets 255 may be introduced above and below the coil electrode 253a, if needed, to assist in generating the plasma. In this case, a DC magnetic field B formed by the permanent magnets 255 acts on plasma current J induced by the coil electrode 253a to generate a J×B drift mode plasma, or acts on an AC electric field E generated by the coil electrode 253a to generate an E×B drift mode plasma. Thus, a plasma density increases, thereby significantly improving a production amount of active species in the reaction gas. Further, although a capacitively coupled plasma (CCP) generated by using a flat plate electrode instead of the coil electrode 253a may be used, the plasma generated by the action on the magnetic field of the permanent magnets 255 only becomes the E×B drift mode plasma. Since plasma electrons are supplemented (trapped) in the magnetic field of the permanent magnets 255 by installing the permanent magnets 255 in the first plasma generator 270a to assist in generating the plasma, a deactivation (disappearance) rate of plasma electrons at a side surface of the process chamber 201 decreases. As a result, a plasma generation efficiency is improved.

(Second Plasma Generator)

A second plasma generator 270b, which is disposed above the upper vessel 202a and partially protrudes toward the inside of the process chamber 201, includes a U-shaped coil electrode 253b (simply referred to as a coil) formed of a conductive metal pipe protected by an insulator 271 fixed to a pedestal 272, and a cylindrical or rectangular parallelepiped electromagnetic wave shield 254b formed of a conductive metal plate. The insulator 271 is made of an insulating material and is installed at an upper portion of the process chamber 201 to protrude toward an inside of the process chamber 201. The coil electrode 253b is installed along the insulator 271. Further, the insulator 271 uses a rounded rectangular parallelepiped shape, a cylindrical shape, or a pipe shape for its protruding portion, internal and external atmospheres of which are isolated by a vacuum seal. High-frequency power from a high-frequency power source 252b is supplied via a matching apparatus 251b connected to one end of the coil electrode 253b, and a ground to which the other end of the coil electrode 253b and the electromagnetic wave shield 254b are connected. When a reaction gas is supplied to the process chamber 201, an inductively coupled plasma (ICP) is generated by an AC magnetic field induced by the coil electrode 253b. A remote plasma generator may be used instead of the second plasma generator 270b.

Since the second plasma generator 270b partially protrudes toward the inside of the process chamber 201 and a ratio (region) of plasma coupled (intersected) with the electromagnetic field emitted from the coil electrode 253b thus increases, an efficiency of inputting RF power of plasma is improved. As a result, the plasma generation efficiency is improved.

The second plasma generator 270b includes a U-shaped coil electrode 253b formed of a conductive metal pipe protected by an insulator and a cylindrical or rectangular parallelepiped electromagnetic wave shield 254b formed of a conductive metal plate. Thus, as a surface area of the coil electrode parallel to a surface of an insulating protective material of the coil electrode is larger, the plasma generation efficiency may be further improved. That is, when a shape of the insulating protective material of the coil electrode has a curved surface, a shape of the coil electrode may also have a curved surface and curvature to be parallel to the curved surface, thus further improving the plasma generation efficiency.

The coil electrode 253b is not limited to the U-shape but may be, for example, a disc-shaped or spiral-shaped coil. The second plasma generator 270b is not limited to, for example, a case where one second plasma generator is installed at a position corresponding to a center of the wafer 200, but a plurality of second plasma generators may be installed based on a plasma distribution.

When the high-frequency powers are supplied from the high-frequency power sources 252a and 252b, resistance values of the coil electrode 253a of the first plasma generator and the coil electrode 253b of the second plasma generator gradually increases by generation of Joule heat. Thus, the matching apparatuses 251a and 251b, which try to obtain an impedance matching, are likely to become unstable. Accordingly, the coil electrodes 253a and 253b need be cooled with water, air, or the like so that resistance values of the coil electrodes 253a and 253b become constant, thus stabilizing their temperatures.

(Gas Supply System)

A first gas supply pipe 150a is connected to the first gas introduction port 241a. A first processing gas supply pipe 113 and a purge gas supply pipe 133a are connected to the first gas supply pipe 150a such that a first processing gas and a purge gas as described below are supplied to the first gas introduction port 241a. A second gas supply pipe 150b is connected to the second gas introduction port 241b. A second processing gas supply pipe 123 and a purge gas supply pipe 133b are connected to the second gas supply pipe 150b such that a second processing gas and a purge gas as described below are supplied to the second gas introduction port 241b.

(First Processing Gas Supply System)

The first processing gas supply pipe 113, a mass flow controller (MFC) 115, and a valve 116 are installed at a first processing gas supply system. In addition, a first processing gas source may be included in the first processing gas supply system. Further, when a precursor of a processing gas is a liquid or a solid, a vaporizer may be installed.

(Second Processing Gas Supply System)

The second processing gas supply pipe 123, a MFC 125, and a valve 126 are installed at a second processing gas supply system. Further, a second processing gas source may be included in the second processing gas supply system.

(Purge Gas Supply System)

Two systems, one including the purge gas supply pipe 133a, a MFC 135a and a valve 136a and the other including the purge gas supply pipe 133b, a MFC 135b, and a valve 136b, are installed at a purge gas supply system. Further, a purge gas source may be included in the purge gas supply system.

(Control Part)

As illustrated in FIG. 1, the substrate processing apparatus 100 includes a controller 260 configured to control operations of respective parts of the substrate processing apparatus 100.

Figure 2:
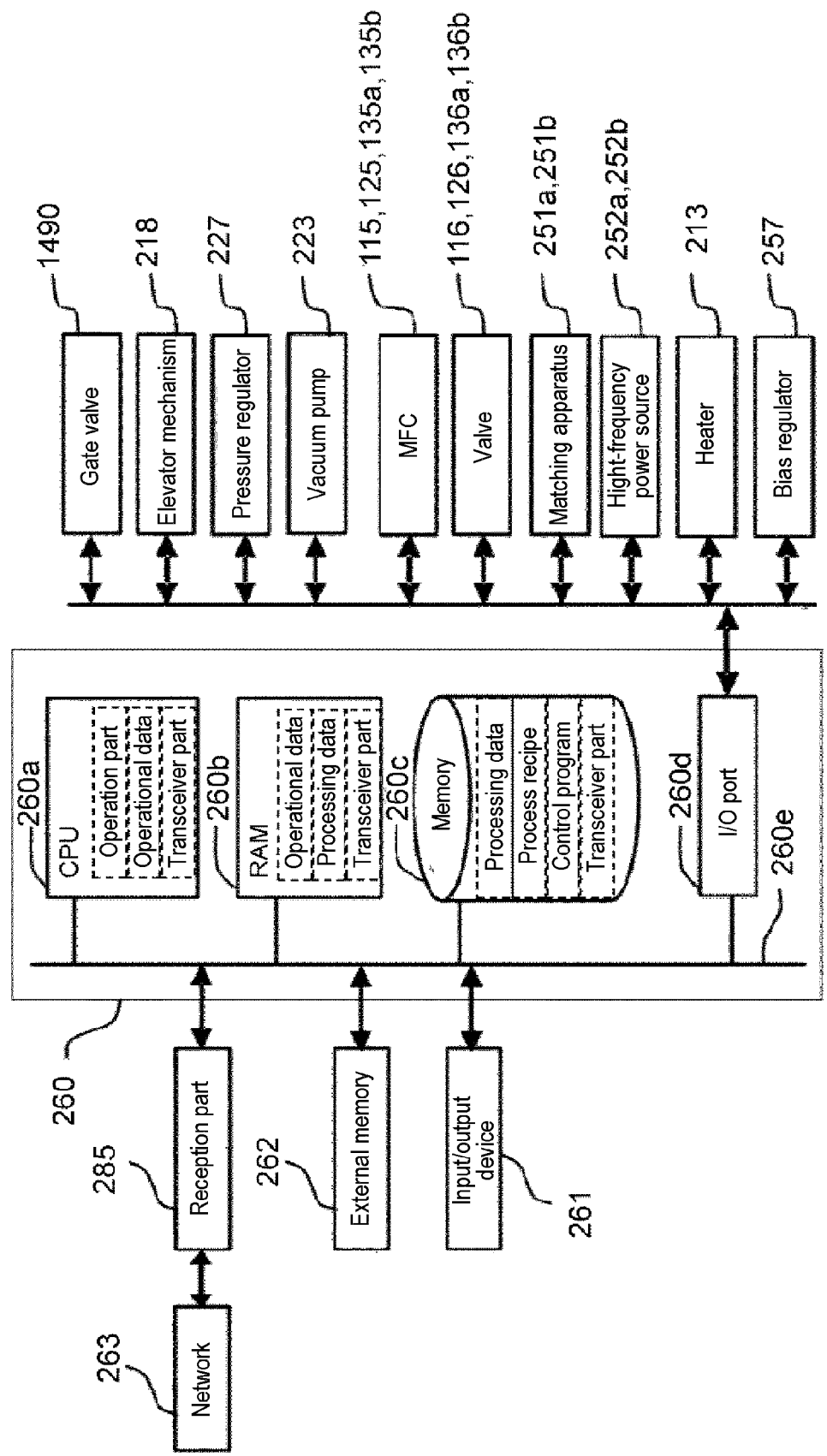
FIG. 2 is a schematic configuration diagram of a controller of the substrate processing apparatus according to some embodiments of the present disclosure.

An outline of the controller 260 is illustrated in FIG. 2. The controller 260 as a control part (control device) is configured as a computer including a central processing unit (CPU) 260a, a random access memory (RAM) 260b, a memory 260c, and an I/O port 260d. The RAM 260b, the memory 260c, and the I/O port 260d are configured to be capable of exchanging data with the CPU 260a via an internal bus 260e. An input/output device 261 formed of, for example, a touch panel and the like, an external memory 262, a reception part 285, and the like are configured to be connected to the controller 260.

The memory 260c includes, for example, a flash memory, a hard disk drive (HDD), or the like. A control program configured to control operations of the substrate processing apparatus 100, a process recipe in which sequences, conditions, and the like of substrate processing as described below are specified, operational data or processing data generated during the process until setting the process recipe used in processing the wafer 200, or the like is readably stored in the memory 260c. Further, the process recipe functions as a program configured to cause the controller 260 to execute each sequence in the substrate processing described below, to obtain a predetermined result. Hereinafter, the process recipe and the control program will be generally and simply referred to as a "program." Further, when the term "program" is used herein, it may indicate a case of including only the process recipe, a case of including only the control program, or a case of including both the process recipe and the control program. Further, the RAM 260b includes a memory area (work area) in which a program, or data such as operational data or processing data or the like read by the CPU 260a is temporarily stored.

The I/O port 260d is connected to the gate valve 1490, the elevator mechanism 218, the heater 213, the pressure regulator 227, the vacuum pump 223, the matching apparatuses 251a and 251b, the high-frequency power sources 252a and 252b, the MFCs 115, 125, 135a and 135b, the valves 116, 126, 136a and 136b, the bias regulator 257, and the like.

The CPU 260a as an operation part is configured to read the control program from the memory 260c and execute the same. The CPU 260a also reads the process recipe from the memory 260c according to an input of an operation command from the input/output device 261. Further, the CPU 260a is configured to be capable of calculating operational data by comparing and operating a set value input from the reception part 285 with the process recipe or control data stored in the memory 260c. Further, the CPU 260a is configured to be capable of executing a process of determining corresponding processing data (process recipe) from the operational data. Further, the CPU 260a is configured to be capable of performing, according to contents of the process recipe thus read, an opening/closing operation of the gate valve 1490, an elevation of the elevator mechanism 218, an operation of supplying electric power to the heater 213, a pressure regulating operation of the pressure regulator 227, an ON/OFF operation of the vacuum pump 223, a gas flow rate control operation of the MFCs 115, 125, 135a and 135b, an ON/OFF operation of the gas to the valves 116, 126, 136a and 136b, a matching control of electric power of the matching apparatuses 251a and 251b, a power control of the high-frequency power sources 252a and 252b, and a potential control of the susceptor electrode 256 by the bias regulator 257.

Further, the controller 260 is not limited to being configured as a dedicated computer but may be configured as a general-purpose computer. For example, the controller 260 according to the embodiments may be configured by installing, on the general-purpose computer, the aforementioned program stored in the external memory 262 (for example, a magnetic tape, a magnetic disc such as a flexible disc or a hard disc, an optical disc such as a CD or DVD, a magneto-optical disc such as a MO, or a semiconductor memory such as a USB memory or a memory card). Further, means configured to supply the program to the computer is not limited to supplying the program via the external memory 262. For example, the program may be supplied by using a communication means such as the reception part 285 or a network 263 (the Internet or a dedicated line) without using the external memory 262. Further, the memory 260c or the external memory 262 is configured as a computer-readable recording medium. Hereinafter, the memory 260c and the external memory 262 will be generally and simply referred to as a "recording medium." When the term "recording medium" is used herein, it may indicate a case of including only the memory 260c, a case of including only the external memory 262, or a case of including both the memory 260c and the external memory 262.

(2) Substrate Processing

Next, a flow and sequence example of forming an insulating film, for example, a silicon nitride (SiN) film as a nitride film, on a substrate by using the aforementioned substrate processing apparatus 100, which is a process of manufacturing a semiconductor device, will be described with reference to FIGS. 3 and 4. In the following descriptions, the operations of the respective parts constituting the substrate processing apparatus 100 are controlled by the controller 260.

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Further, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

The substrate processing will be described below.

(Substrate Loading Step S201)

First, the wafer 200 is loaded into the process chamber 201 during a film-forming process. Specifically, the substrate support 210 is lowered by the elevator mechanism 218 such that the lift pins 207 protrude from the through-holes 214 toward an upper surface side of the substrate support 210. Further, the pressures of the process chamber 201 and the transfer chamber 203 are regulated to a predetermined pressure, and thereafter, the gate valve 1490 is opened and the wafer 200 is mounted on the lift pins 207 via the substrate loading/unloading port 1480 by using a transfer mechanism (not shown) such as a tweezer. After the wafer 200 is mounted on the lift pins 207, the gate valve 1490 is closed and the substrate support 210 is raised to a predetermined position by the elevator mechanism 218 such that the wafer 200 is mounted on the substrate support 210 from the lift pins 207.

(First Pressure Regulation and Temperature Regulation Step S202)

Subsequently, the valves 136a and 136b are opened such that the process chamber 201 has a predetermined pressure, the MFC 135a and 135b are adjusted to supply a $N_2$ gas at a predetermined flow rate, and the atmosphere of the process chamber 201 is exhausted via the exhaust port 221. At this time, an opening degree of the valve of the pressure regulator 227 is feedback-controlled based on a pressure value measured by a pressure sensor (not shown). Further, electric power to the heater 213 is feedback-controlled based on a temperature value detected by a temperature sensor (not shown) such that the process chamber 201 reaches a predetermined temperature. Specifically, the substrate support 210 is pre-heated by the heater 213, and is left for a certain period of time after the temperature of the wafer 200 or the substrate support 210 is stabilized. During this time, when there is moisture or gas desorbed from any member remaining within the process chamber 201, purge by a $N_2$ gas or the like may be used in removing such moisture or gas effectively. Thus, preparation before the film-forming process is completed. Further, before the process chamber 201 is set at a predetermined pressure, the process chamber 201 may be vacuum-exhausted once up to an attainable degree of vacuum.

The temperature of the heater 213 at this time may be set to become a constant temperature which falls within a range of 100 to 600 degrees C., specifically 150 to 500 degrees C., or more specifically 250 to 450 degrees C. in some embodiments, from a temperature during an idle state.

Further, a voltage is applied to the susceptor electrode 256 by the bias regulator 257 such that the potential of the wafer 200 becomes a predetermined potential.

(Film-Forming Step S301)

Next, an example of forming a SiN film on the wafer 200 will be described. Details of a film-forming step S301 will be described with reference to FIGS. 3 and 4.

Figure 3:
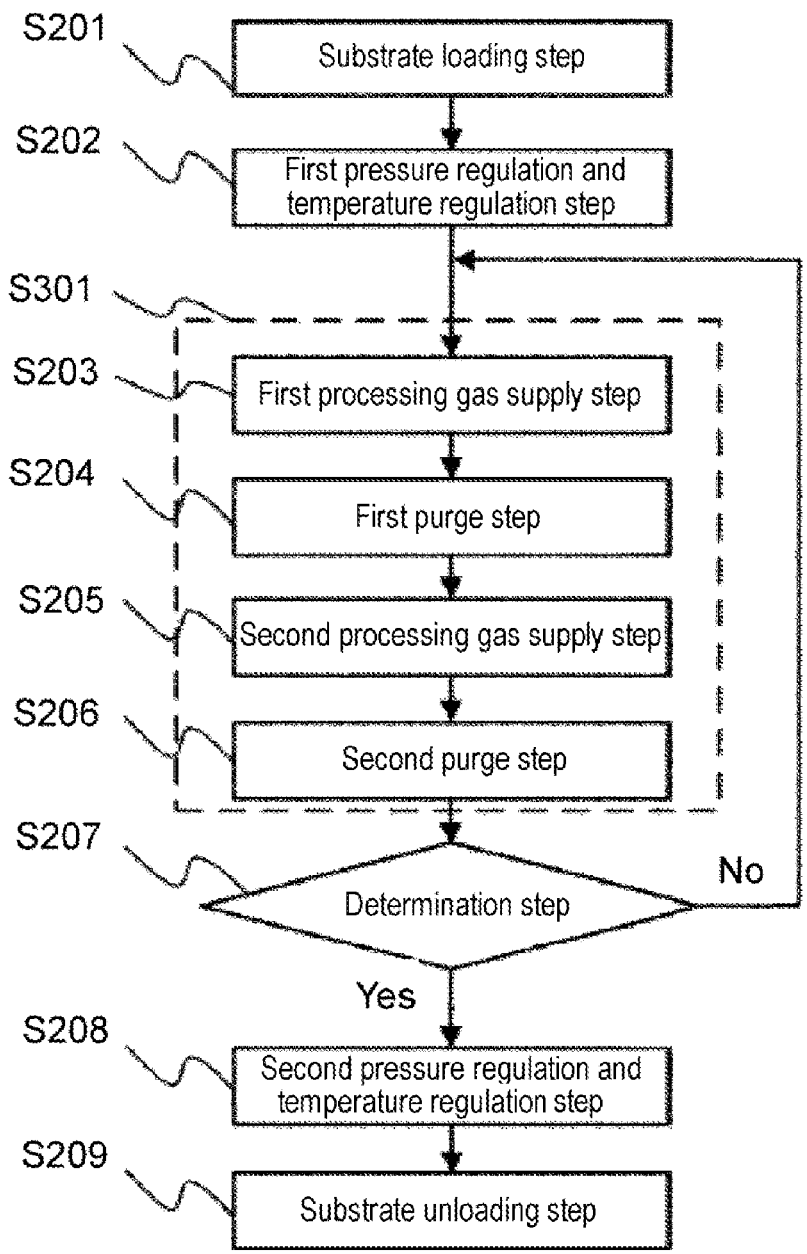
FIG. 3 is a flowchart illustrating substrate processing according to some embodiments of the present disclosure.
Figure 4:
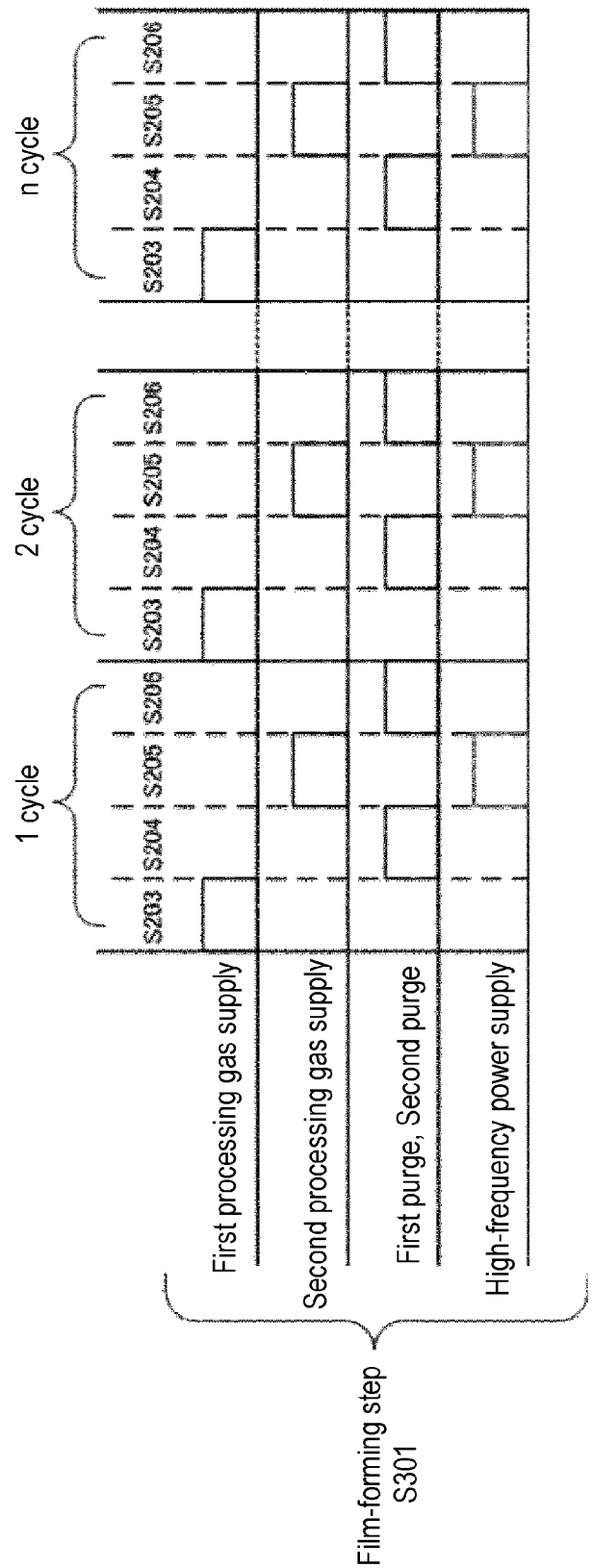
FIG. 4 is a sequence example of the substrate processing according to some embodiments of the present disclosure.

After the wafer 200 is mounted on the substrate support 210 and the atmosphere of the process chamber 201 is stabilized, steps S203 to S207 illustrated in FIGS. 3 and 4 are performed.

(First Processing Gas Supply Step S203)

At a first processing gas supply step S203, a dichlorosilane ($SiH_2Cl_2$, abbreviation: DCS) gas as the first processing gas (precursor gas) is supplied from the first processing gas supply system to the process chamber 201. Specifically, the valve 116 is opened, and a flow rate of the first processing gas supplied from the processing gas supply source is regulated by the MFC 115. Then, the first processing gas is supplied to the substrate processing apparatus 100. The flow rate-regulated first processing gas passes through the first buffer chamber 232a of the first gas dispersion unit 235a and is supplied from the plurality of first dispersion holes 234a to the process chamber 201 in a depressurized state. Further, the exhaust of the process chamber 201 by the exhaust system is continued, and the pressure regulator 227 is controlled such that the pressure of the process chamber 201 falls within a predetermined pressure range (first pressure). At this time, the first processing gas is supplied to the process chamber 201 at a predetermined pressure (first pressure: for example, 100 Pa or more and 10 kPa or less). By supplying the first processing gas in this way, a silicon-containing layer is formed on the wafer 200. The silicon-containing layer herein is a layer containing silicon (Si), or silicon and chlorine (Cl).

(First Purge Step S204)

At a first purge step S204, after the silicon-containing layer is formed on the wafer 200, the valve 116 of the first processing gas supply pipe 113 is closed to stop the supply of the first processing gas. The operation of the vacuum pump 223 is continued and the supply of the first processing gas is stopped such that residual gas such as the first processing gas or the reaction byproduct material remaining within the process chamber 201 and the processing gas remaining within the first buffer chamber 232a are exhausted from the vacuum pump 223. Thus, the purge is performed.

In this case, the valve 136a of the purge gas supply system is opened and the MFC 135a is regulated to supply a $N_2$ gas as a purge gas such that the residual gas within the first buffer chamber 232a may be pushed out and an efficiency of removing the residual gas such as the first processing gas or the reaction byproduct material on the wafer 200 may be improved. At this time, another purge gas supply system may be combined, or the supply and the stop of the purge gas may be alternately performed.

After a lapse of a predetermined period of time, the valve 136a is closed to stop the supply of the purge gas. Further, the supply of the purge gas may be continued while opening the valve 136a. By continuing to supply the purge gas to the first buffer chamber 232a, it is possible to suppress a processing gas used at another step from entering the first buffer chamber 232a.

Further, at this time, the flow rate of the purge gas supplied to the process chamber 201 or the first buffer chamber 232a may not be large. For example, the purge gas may be supplied at a flow rate corresponding to a volume of the process chamber 201, whereby the purge may be performed such that no adverse effect occurs at the subsequent step. By not completely purging the process chamber 201 in this way, it is possible to shorten a purge time and to improve a manufacturing throughput. Further, it is possible to suppress consumption of the purge gas to a minimum level as needed.

The temperature of the heater 213 at this time may be set at the same temperature as when supplying the first processing gas to the wafer 200. The supply flow rate of the purge gas supplied from the purge gas supply system may be set at a flow rate which falls within a range of, for example, 100 to 10,000 sccm. As the purge gas, a rare gas such as Ar, He, Ne, and Xe may be used in addition to the $N_2$ gas, or a combination thereof may be used.

(Second Processing Gas Supply Step S205)

At a second processing gas supply step S205, the valve 126 of the second processing gas supply system is opened to supply an ammonia ($NH_3$) gas as the second processing gas (a reaction gas as the second processing gas having a chemical structure (molecular structure) different from a chemical structure of the first processing gas) to the process chamber 201 under a depressurized pressure via the second buffer chamber 232b of the second gas dispersion unit 235b and the plurality of second dispersion holes 234b. At this time, the MFC 125 is regulated such that the second processing gas has a predetermined flow rate (for example, to 100 sccm or more and 5,000 sccm or less) while continuously exhausting the process chamber 201 by the exhaust system, and the pressure regulator 227 is controlled (to a second pressure: for example, 1 Pa or more and 200 Pa or less) such that the process chamber 201 has a predetermined pressure.

Further, high-frequency power is supplied from the high-frequency power sources 252a and 252b to the coil electrode 253a of the first plasma generator 270a and the coil electrode 253b of the second plasma generator 270b via the matching apparatuses 251a and 251b. The high-frequency power at this time is optimally distributed by the high-frequency power source 252a and the high-frequency power source 252b such that the plasma distribution in the process chamber 201 becomes uniform in a horizontal direction on the wafer 200. In FIG. 4, the supply of the high-frequency power starts simultaneously with the supply of the second processing gas, but it may be supplied from before the start of the supply of the second processing gas or may be continued thereafter. By supplying the high-frequency power, plasma of the second processing gas can be generated on the wafer 200. Thus, since active species of the activated (excited) second processing gas can be supplied to the silicon-containing layer, a nitriding process can be performed on the silicon-containing layer at a low temperature.

In this case, the electric power supplied from the high-frequency power source 252a to the first plasma generator 270a may be set to 1,000 to 5,000 W, specifically 3,000 to 5,000 W, or more specifically 3,500 to 4,500 W in some embodiments. In a case where the electric power is less than 1,000 W, plasma of a CCP mode becomes dominant, and thus an amount of active species produced becomes very low. Therefore, a processing speed of the wafer becomes very low. Further, in a case where the electric power exceeds 5,000 W, the plasma starts to strongly sputter the inner wall of the reaction chamber made of a quartz material, a material such as Si or O, which is not desirable for films (other than the SiO film) on the wafer 200, is supplied.

Further, the electric power supplied from the high-frequency power source 252b to the second plasma generator 270b may be set to 100 to 2,000 W, or specifically 500 to 1,000 W in some embodiments. In a case where the electric power is less than 100 W, the plasma of the CCP mode becomes dominant, and thus the amount of active species produced becomes very low. Therefore, the processing speed of the wafer becomes very low. Further, if the electric power exceeds 1,000 W, the plasma starts to strongly sputter the outer wall (reaction chamber side) of a quartz protective member, and thus a material such as Si or O, which is not desirable for films (other than the SiO film) on the substrate, is supplied.

Further, the plasma processing time may be set to 60 to 600 seconds, specifically 120 to 300 seconds. In a case where the plasma processing time is less than 60 seconds, a sufficient film thickness may not be achieved. Further, in a case where the plasma processing time exceeds 600 seconds, a film uniformity is adversely affected by a step in the plane of the wafer 200 or on the wafer 200, and furthermore, the wafer 200 is damaged.

Further, by regulating the potential of the susceptor electrode 256 installed in the substrate mounting table 212 by the bias regulator 257, it is possible to control the supply amount of plasma charged particles to the wafer 200. For example, when a surface of the wafer 200 is step-processed, the supply amount of plasma charged particles is suppressed, thereby improving a coating rate of film formation effectively.

When the active species of the activated second processing gas is supplied to the silicon-containing layer formed on the wafer 200, a modification process, such as recovery of molecular bond defect or delamination of impurities, is also performed on the silicon-containing layer. For example, a nitriding process or a modification process is performed on the silicon-containing layer at a predetermined distribution, a predetermined depth, and a predetermined nitrogen composition ratio according to the pressure of the process chamber 201, the flow rate of the second processing gas by the MFC 125, the temperature of the wafer 200 by the heater 213, the electric power of the high-frequency power sources 252a and 252b, the potential of the susceptor electrode 256 by the bias regulator 257, or the like.

After a lapse of a predetermined period of time, the valve 126 of the second processing gas supply system is closed to stop the supply of the second processing gas.

The temperature of the heater 213 at this time may be set at the same temperature as when supplying the first processing gas to the wafer 200.

(Second Purge Step S206)

At a second purge process S206, after the nitrogen-containing layer is formed on the wafer 200, the valve 126 of the second processing gas supply pipe 123 is closed to stop the supply of the second processing gas. By continuing the operation of the vacuum pump 223 and stopping the second processing gas, the residual gas such as the second processing gas or the reaction byproduct material remaining within the process chamber 201 or the processing gas remaining within the second buffer chamber 232b is exhausted from the vacuum pump 223. Thus, the purge is performed.

In this case, the valve 136b of the purge gas supply system is opened and the MFC 135b is adjusted to supply a $N_2$ gas as a purge gas such that the residual gas within the second buffer chamber 232b may be pushed out and the efficiency of removing the residual gas such as the second processing gas or the reaction byproduct on the wafer 200 may be improved. At this time, another purge gas supply system may be combined, or the supply and the stop of the purge gas may be alternately performed.

After a lapse of a predetermined period of time, the valve 136b is closed to stop the supply of the purge gas. Further, the supply of the purge gas may be continued while opening the valve 136b. By continuing to supply the purge gas to the second buffer chamber 232b, it is possible to suppress a processing gas at another step from entering the second buffer chamber 232b.

Further, at this time, the flow rate of the purge gas supplied to the process chamber 201 or the second buffer chamber 232b may not be large, and for example, by supplying the purge gas at a flow rate corresponding to the volume of the process chamber 201, the purge may be performed such that no adverse effect occurs at the subsequent step. By not completely purging the process chamber 201 in this way, it is possible to shorten the purge time and to improve the manufacturing throughput. In addition, it is possible to suppress consumption of the purge gas to a minimum level as needed.

The temperature of the heater 213 at this time may be set at the same temperature as when supplying the second processing gas to the wafer 200. The supply flow rate of the purge gas supplied from the purge gas supply system may be set at a flow rate which falls within a range of, for example, 100 to 10,000 sccm. As the purge gas, a rare gas such as Ar, He, Ne, Xe or the like may be used in addition to the $N_2$ gas, or a combination thereof may be used.

(Determination Step S207)

After the completion of the purge step S206, the controller 260 determines whether or not the film-forming step S301 (S203 to S206) has executed a predetermined number of cycles n. That is, it is determined whether or not a film having a desired thickness is formed on the wafer 200. By setting the aforementioned film-forming step S301 (S203 to S206) as one cycle and performing the cycle at least one or more times, a SiN film having a predetermined thickness can be formed on the wafer 200. Further, the aforementioned cycle may be performed multiple times. Thus, a SiN film having a predetermined thickness is formed on the wafer 200.

At a determination step S207, when the film-forming step S301 is not performed a predetermined number of times (when the determination is "No"), the cycle of the film-forming step S301 is repeated, and when the film-forming step S301 is performed the predetermined number of times (when the determination is "Yes"), the film-forming step S301 is completed.

(Second Pressure Regulation and Temperature Regulation Step S208)

The valves 136a and 136b are opened such that the process chamber 201 has a predetermined pressure, the MFC 135a and 135b are adjusted to supply a $N_2$ gas at a predetermined flow rate, and the pressure regulator 227 is controlled based on a pressure value measured by a predetermined pressure sensor (not shown). Further, the electric power to the heater 213 is controlled based on a temperature value detected by a temperature sensor (not shown) such that the process chamber 201 reaches a predetermined temperature. For example, the pressure of the process chamber 201 may be set at the same pressure as when opening the gate valve 1490 at the first pressure regulation and temperature regulation step S202, and the temperature of the heater 213 may be set at the temperature during the idle state. In addition, in a case where a subsequent wafer 200 is continuously processed under the same temperature condition, the temperature of the heater 213 may be maintained.

(Substrate Unloading Step S209)

Subsequently, the substrate support 210 is lowered by the elevator mechanism 218, and the lift pins 207 protrude from the through-holes 214 toward the upper surface side of the substrate support 210 such that the wafer 200 is mounted on the lift pins 207. The gate valve 1490 is opened, the wafer 200 is transferred to the outside of the transfer chamber 203 via the substrate loading/unloading port 1480 by using a transfer mechanism (not shown) such as a tweezer, and gate valve 1490 is closed.

OTHER EMBODIMENTS

Other embodiments of the present disclosure will now be described with reference to the drawings.

A substrate processing apparatus 100A according to other embodiments of the present disclosure is identical to the substrate processing apparatus 100 of the aforementioned embodiments except for the configuration of the first plasma generator. Hereinafter, the first plasma generator will be mainly described.

Figure 5:
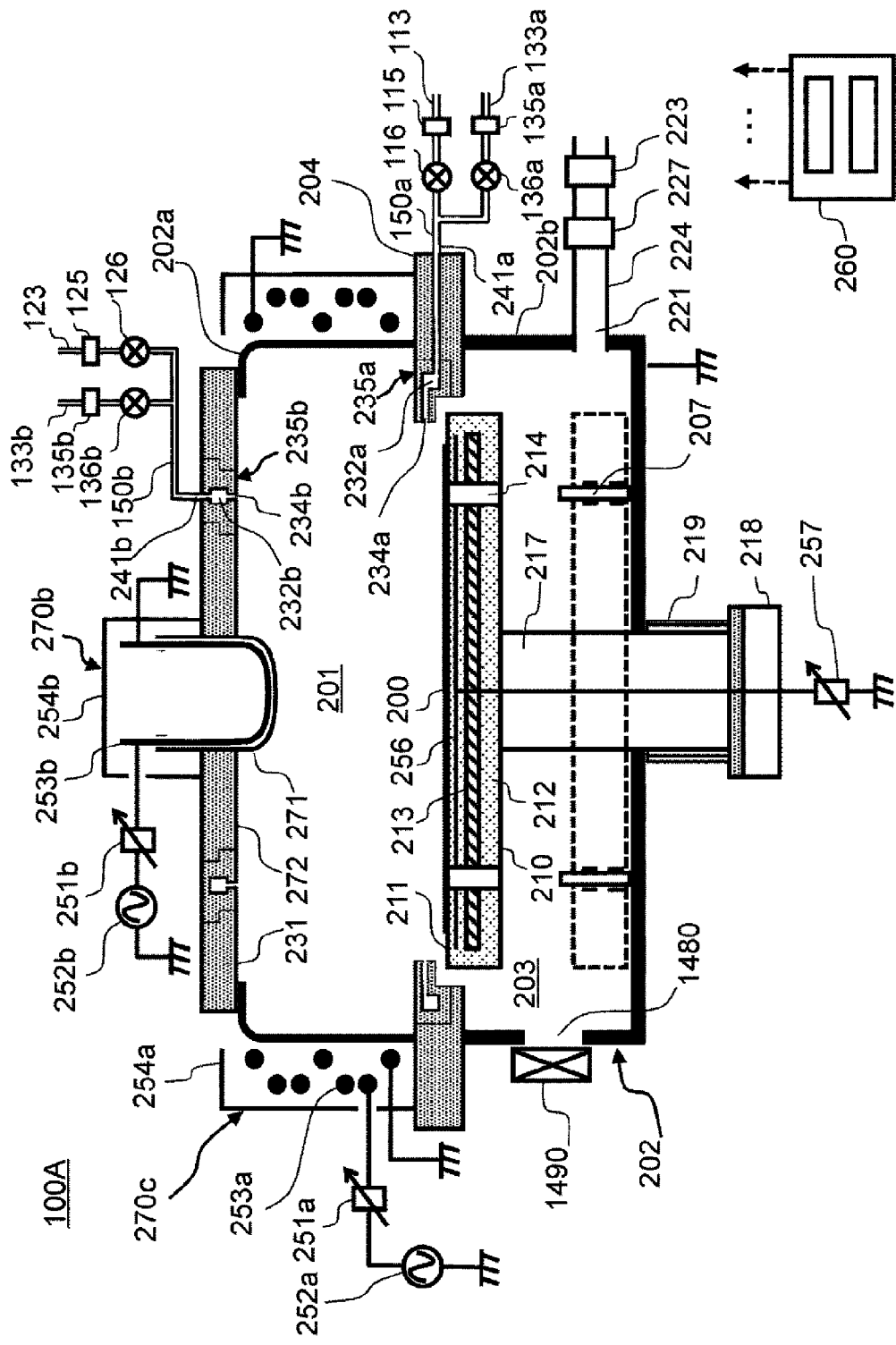
FIG. 5 is a schematic configuration diagram of a substrate processing apparatus according to other embodiments of the present disclosure.

As illustrated in FIG. 5, a first plasma generator 270c disposed outside the upper vessel 202a includes a spiral-shaped coil electrode 253a formed of a conductive metal pipe and having 7 to 8 turns, and a cylindrical electromagnetic wave shield 254a formed of a conductive metal plate. High-frequency power from a high-frequency power source 252a is supplied via a matching apparatus 251a connected at ⅛ to ½ turns from a bottom of the coil electrode 253a and a ground to which a vicinity of both ends of the coil electrode 253a and the electromagnetic shield 254a are connected. In the high-frequency supplied by the high-frequency power source 252a, positions where a strong AC current and a weak AC voltage are generated in a standing wave resonance mode can be simultaneously formed near the first turn, the fourth turn and the seventh turn from the bottom of the coil electrode 253a by setting the wavelength generated by the high-frequency substantially identical to a total length of the coil electrode 253a. Therefore, positions where the strong AC voltage is generated may be kept away from plasma by keeping the vicinity of the second turn, the third turn, the fifth turn, and the sixth turn from the bottom of the coil electrode 253a away from the upper vessel 202a. Thus, it is possible to suppress acceleration of plasma ions moving toward the inner wall of the upper vessel 202a. When a reaction gas is supplied to the process chamber 201, an inductively coupled plasma (ICP) is predominantly generated near the first turn, the fourth turn and the seventh turn from the bottom of the coil electrode 253a by an AC magnetic field induced by the coil electrode 253a. Thus, it is possible to increase plasma density while suppressing sputtering or etching of the inner wall of the upper vessel 202a, and to significantly improve a production amount of active species of the reaction gas.

Although the embodiments of the present disclosure have been described in detail above, the present disclosure is not limited to the aforementioned embodiments but may be variously modified without departing from the spirit of the present disclosure.

There has been described above the method in which the films are formed by supplying the reaction gas after supplying the precursor gas and alternately supplying the gases. However, for example, a method in which a supply order of the precursor gas and the reaction gas may be reversed, and supply timings of the precursor gas and the reaction gas overlap may be applied. By changing the supply method in this way, it is possible to change a quality and a composition ratio of the film as formed.

Further, there has been described above examples in which a silicon nitride film is formed by using the DCS gas, which is a silicon-containing gas, as the precursor gas and the $NH_3$ gas, which is a nitrogen-containing gas, as the reaction gas, but the present disclosure may be applied to a case where an oxygen-containing film or a carbon-containing film is formed by using other gases. Specifically, the present disclosure may be suitably applied to a case where a Si-based oxide film or a Si-based carbide film such as a silicon oxide film (SiO film), a silicon carbide film (SiC film), a silicon oxycarbide film (SiOC film), a silicon oxycarbonitride film (SiOCN film), and a silicon oxynitride film (SiON film) is formed on the wafer 200.

As the precursor gas, it may be possible to suitably use, in addition to the DCS gas, for example, an inorganic halosilane precursor gas such as a monochlorosilane ($SiH_3Cl$, abbreviation: MCS) gas, a trichlorosilane ($SiHCl_3$, abbreviation: TCS) gas, tetrachlorosilane, that is, a silicon tetrachloride ($SiCl_4$, abbreviation: STC)) gas, a hexachlorodisilane ($Si_2Cl_6$, abbreviation: HCDS) gas, and an octachlorotrisilane ($Si_3Cl_8$, abbreviation: OCTS) gas, various types of aminosilane precursor gases such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(dimethylamino)silane ($Si[N(CH_3)_2]_2H_2$, abbreviation: BDMAS) gas, a bis(diethylamino)silane ($Si[N(C_2H_5)_2]_2H_2$, abbreviation: BDEAS) gas, a bis(tertiary-butylamino)silane ($SiH_2[NH(C_4H_9)]_2$, abbreviation: BTBAS) gas, a dimethylaminosilane (DMAS) gas, a diethylaminosilane (DEAS) gas, a dipropylaminosilane (DPAS) gas, a diisopropylaminosilane (DIPAS) gas, a butylaminosilane (BAS) gas, and a hexamethyldisilazane (HMDS) gas, various types of organic silane precursor gases such as a monomethylsilane ($Si(CH_3)H_3$, abbreviation: MMS) gas, a dimethylsilane ($Si(CH_3)_2H_2$, abbreviation: DMS) gas, a trimethylsilane ($Si(CH_3)_3H$, abbreviation: 3MS) gas, a tetramethylsilane ($Si(CH_3)_4$, abbreviation: 4MS) gas, and a 1,4 disilabutane (abbreviation: 1,4DSB) gas, or a halogen group-free inorganic silane precursor gas such as a monosilane ($SiH_4$, abbreviation: MS) gas, a disilane ($Si_2H_6$, abbreviation: DS) gas, and a trisilane ($Si_3Hg$, abbreviation: TS) gas.

Further, the aminosilane precursor refers to a silane precursor containing an amino group and to a silane precursor containing an alkyl group such as a methyl group, an ethyl group, and a butyl group. The aminosilane precursor is a precursor containing at least Si, nitrogen (N) and carbon (C). That is, the aminosilane precursor referred to herein may be an organic precursor or may be an organic aminosilane precursor.

As the reaction gas, it may be possible to suitably use, in addition to the $NH_3$ gas, for example, a hydrogen-containing gas such as a nitrogen gas, a diazene ($N_2H_2$) gas, a hydrazine ($N_2H_4$) gas, and a $N_3H_8$ gas.

Further, an amine-based gas may be used as another nitrogen-containing gas. The amine-based gas refers to a gas containing an amine group and to a gas containing at least carbon (C), nitrogen (N), and hydrogen (H). The amine-based gas contains amine such as ethylamine, methylamine, propylamine, isopropylamine, butylamine, and isobutylamine. In the present disclosure, amine is a general term for compounds in which hydrogen atoms of ammonia ($NH_3$) are substituted with hydrocarbon groups such as alkyl groups. That is, amine contains hydrocarbon groups such as alkyl groups. Since the amine-based gas does not contain silicon (Si), it may be said to be a gas that does not contain silicon, and further, since the amine-based gas does not contain silicon and metal, it may be said to be a gas that does not contain silicon and metal. As the amine-based gas, it may be possible to suitably use, for example, an ethylamine-based gas such as a triethylamine (($C_2H_5)_3N$, abbreviation: TEA), a diethylamine (($C_2H_5)_2NH$, abbreviation: DEA), and a monoethylamine ($C_2H_5NH_2$, abbreviation: MEA), a methylamine-based gas such as trimethylamine (($CH_3)_3N$, abbreviation: TMA), dimethylamine (($CH_3)_2NH$, abbreviation: DMA), and monomethylamine ($CH_3NH_2$, abbreviation: MMA), a propropylamine-based gas such as tripropylamine (($C_3H_7)_3N$, abbreviation: TPA), dipropylamine (($C_3H_7)_2NH$, abbreviation: DPA), and monopropylamine ($C_3H_7NH_2$, abbreviation: MPA), an isopropylamine-based gas such as triisopropylamine ($[(CH_3)_2CH]_3N$, abbreviation: TIPA), diisopropylamine ($[(CH_3)_2CH]_2NH$, abbreviation: DIPA), and monoisopropylamine (($CH_3)_2CHNH_2$, abbreviation: MIPA), a butylamine-based gas such as tributylamine (($C_4H_9)_3N$, abbreviation: TBA), dibutylamine (($C_4H_9)_2NH$, abbreviation: DBA), and monobutylamine ($C_4H_9NH_2$, abbreviation: MBA), or an isobutylamine-based gas such as triisobutylamine ($[(CH_3)_2CHCH_2]_3N$, abbreviation: TIBA), diisobutylamine ($[(CH_3)_2CHCH_2]_2NH$, abbreviation: DIBA), and monoisobutylamine (($CH_3)_2CHCH_2NH_2$, abbreviation: MIBA). That is, as the amine-based gas, it may be possible to suitably use, for example, at least one type of gas selected from the group of $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, and $[(CH_3)_2CHCH_2]_xNH_{3-x}$ (where x is an integer of 1 to 3 in the formula). The amine-based gas acts as a nitrogen source when forming a SiN film, a SiCN film, a SiOCN film, or the like, and also acts as a carbon source. By using the amine-based gas as the nitrogen-containing gas, the carbon component in the film may be controlled to increase.

For example, an oxidizing agent (oxidizing gas), that is, an oxygen-containing gas acting as an oxygen source, may be applied as another reaction gas. For example, an oxygen-containing gas such as an oxygen ($O_2$) gas, water vapor ($H_2O$ gas), a nitrous oxide ($N_2O$) gas, a nitrogen monoxide (NO) gas, a nitrogen dioxide ($NO_2$) gas, an ozone ($O_3$) gas, a hydrogen peroxide ($H_2O_2$) gas, water vapor ($H_2O$ gas), a carbon monoxide (CO) gas, and a carbon dioxide ($CO_2$) gas may be suitably used.

The present disclosure may be suitably applied to a case where a semimetal-based film containing a semimetal element or a metal-based film containing a metal element is formed. Processing procedures and processing conditions of the film-forming processes may be set to the same processing procedures and processing conditions as those of the film-forming process described in the embodiments and modifications described above. Even in these cases, the same effects as those of the aforementioned embodiments may be achieved.

Further, the present disclosure may be suitably applied to a case where a metal-based oxide film or a metal-based nitride film containing a metal element such as titanium (Ti), zirconium (Zr), hafnium (Hf), tantalum (Ta), niobium (Nb), aluminum (Al), molybdenum (Mo), and tungsten (W) is formed on the wafer 200. That is, the present disclosure may be suitably applied to a case where a TiO film, a TiOC film, a TiOCN film, a TiON film, a TiN film, a TiCN film, a ZrO film, a ZrOC film, a ZrOCN film, a ZrON film, a ZrN film, a ZrCN film, a HfO film, a HfOC film, a HfOCN film, a HfON film, a HfN film, a HfCN film, a TaO film, a TaOC film, a TaOCN film, a TaON film, a TaN film, a TaCN film, a NbO film, a NbOC film, a NbOCN film, a NbON film, a NbN film, a NbCN film, an AlO film, an AlOC film, an AlOCN film, an AlON film, an AN film, an AlCN film, a MoO film, a MoOC film, a MoOCN film, a MoON film, a MoN film, a MoCN film, a WO film, a WOC film, a WOCN film, a WON film, a WN film, a WCN film or the like is formed on the wafer 200.

In these cases, as the precursor gas, it may be possible to use, for example, a tetrakis(dimethylamino)titanium (Ti[N($CH_3$)$_2$]$_4$, abbreviation: TDMAT) gas, a tetrakis(ethylmethylamino)hafnium (Hf[N($C_2H_5$)($CH_3$)]$_4$, abbreviation: TEMAH gas, a tetrakis(ethylmethylamino)zirconium (Zr[N($C_2H_5$)($CH_3$)]$_4$, abbreviation: TEMAZ) gas, a trimethylaluminum (Al($CH_3$))$_3$, abbreviation: TMA) gas, a titanium tetrachloride ($TiCl_4$) gas, a hafnium tetrachloride ($HfCl_4$) gas or the like.

In addition, although the film-forming process has been described above, the present disclosure may be applied to other processes. For example, there are a diffusion process, an oxidation process, a nitriding process, an oxynitriding process, a reduction process, an oxidation reduction process, an etching process, a heating process, and the like in which plasma is used. Further, the present disclosure may be applied to a case where a plasma oxidation process, a plasma nitriding process, or a plasma modification process is performed on a film formed on a substrate surface or a substrate by using only the reaction gas. Further, the present disclosure may be applied to a plasma annealing process in which only the reaction gas is used.

In addition, although the process of manufacturing a semiconductor device has been described above, the disclosure according to the embodiments may be applied to processes other than the process of manufacturing a semiconductor device. For example, there are substrate processing such as a liquid crystal device manufacturing process, a solar cell manufacturing process, a light-emitting device manufacturing process, glass substrate processing, ceramic substrate processing, and conductive substrate processing.

Further, there has been described above a configuration of an apparatus in which a single substrate is processed in one process chamber, but the present disclosure is not limited thereto and may be an apparatus in which a plurality of substrates are arranged in the horizontal direction or in the vertical direction.

Recipes used in the film-forming process may be provided individually according to the processing contents and may be stored in the memory 260c via a telecommunication line or the external memory 262. Further, at the start of various processing, the CPU 260a may properly select an appropriate recipe from the recipes stored in the memory 260c according to the processing contents. Thus, it is possible for a single substrate processing apparatus to form films of different types, composition ratios, qualities and thicknesses for general use and with enhanced reproducibility. In addition, it is possible to reduce an operator's burden and to quickly start various processing while avoiding an operation error.

The recipes mentioned above are not limited to newly-provided ones but may be provided by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 261 of the existing substrate processing apparatus.

According to the present disclosure in some embodiments, it is possible to form a uniform film in a substrate surface.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a process chamber in which a substrate is processed;
   a gas supply system configured to supply a processing gas into the process chamber;
   a first plasma generator installed to be wound around an outer periphery of the process chamber and configured to generate plasma from the processing gas in the process chamber; and
   a second plasma generator installed at an upper portion of the process chamber, formed to protrude toward an inside of the process chamber to directly face the substrate, and configured to generate plasma from the processing gas in the process chamber,
   wherein the substrate processing apparatus is configured to supply the plasma generated by the second plasma generator directly to the substrate in the process chamber.

2. The substrate processing apparatus according to claim 1, wherein the second plasma generator includes an insulator installed at the upper portion of the process chamber to protrude toward the inside of the process chamber, and a coil installed along the insulator.

3. The substrate processing apparatus according to claim 2, wherein the second plasma generator is shielded by a cylindrical or rectangular parallelepiped electromagnetic wave shield formed of a conductive metal plate.

4. The substrate processing apparatus according to claim 2, wherein the coil installed at the second plasma generator is a conductive U-shape coil protected by the insulator.

5. The substrate processing apparatus according to claim 3, wherein high-frequency power supplied from a high-frequency power source to the second plasma generator is supplied to the coil via a matching apparatus connected to one end of the coil and a ground to which the other end of the coil and the electromagnetic wave shield are connected.

6. The substrate processing apparatus according to claim 1, wherein the first plasma generator includes a conductive spiral-shaped coil and a conductive cylindrical electromagnetic wave shield.

7. The substrate processing apparatus according to claim 6, wherein the conductive spiral-shaped coil is formed such that a coil winding diameter at a predetermined position is different from a coil winding diameter at another position between one end and the other end of the conductive spiral-shaped coil.

8. The substrate processing apparatus according to claim 6, wherein high-frequency power supplied from a high-frequency power source to the first plasma generator is supplied to the conductive spiral-shaped coil via a matching apparatus connected to both ends of the conductive spiral-shaped coil and a ground to which a vicinity of a middle of the conductive spiral-shaped coil and the electromagnetic wave shield are connected.

9. The substrate processing apparatus according to claim 6, wherein permanent magnets are installed at the first plasma generator.

10. The substrate processing apparatus according to claim 9, wherein the permanent magnets are above and below the conductive spiral-shaped coil installed in the first plasma generator.

11. A method of manufacturing a semiconductor device, comprising:
loading a substrate into a process chamber of a substrate processing apparatus, the substrate processing apparatus comprising:
the process chamber in which the substrate is processed;
a gas supply system configured to supply a processing gas into the process chamber;
a first plasma generator installed to be wound around an outer periphery of the process chamber and configured to generate plasma from the processing gas in the process chamber; and
a second plasma generator installed at an upper portion of the process chamber, formed to protrude toward an inside of the process chamber to directly face the substrate, and configured to generate plasma from the processing gas in the process chamber, wherein the substrate processing apparatus is configured to supply the plasma generated by the second plasma generator directly to the substrate in the process chamber;
supplying the processing gas into the process chamber;
generating plasma from the processing gas on the substrate in the process chamber by the first plasma generator and the second plasma generator; and
unloading the substrate from the process chamber.

* * * * *